(12) United States Patent
Wei et al.

(10) Patent No.: US 7,304,530 B2
(45) Date of Patent: Dec. 4, 2007

(54) UTILIZATION OF DEVICE TYPES HAVING DIFFERENT THRESHOLD VOLTAGES

(75) Inventors: Derrick Chunkai Wei, Austin, TX (US); David Pietruszynski, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 11/172,431

(22) Filed: Jun. 30, 2005

(65) Prior Publication Data

US 2007/0001743 A1 Jan. 4, 2007

(51) Int. Cl.
*G06F 7/44* (2006.01)

(52) U.S. Cl. ............... 327/536; 327/534; 327/535; 327/537; 327/390; 327/391

(58) Field of Classification Search ............ None
See application file for complete search history.

(56) References Cited

U.S. PATENT DOCUMENTS

| | | | |
|---|---|---|---|
| 5,161,159 A * | 11/1992 | McClure et al. | 714/724 |
| 6,160,723 A * | 12/2000 | Liu | 363/60 |
| 6,486,816 B2 | 11/2002 | Seymour | 341/150 |
| 6,696,880 B2 * | 2/2004 | Pan et al. | 327/390 |
| 7,002,427 B2 * | 2/2006 | Nystrom et al. | 333/17.1 |
| 7,006,068 B2 * | 2/2006 | Haga | 345/98 |
| 7,199,641 B2 | 4/2007 | Wei | 327/427 |
| 7,206,062 B2 * | 4/2007 | Asbrock et al. | 356/4.03 |
| 7,206,565 B2 * | 4/2007 | Oh et al. | 455/313 |
| 2002/0001207 A1 * | 1/2002 | Kishimoto et al. | 363/59 |
| 2003/0076149 A1 * | 4/2003 | Haga | 327/333 |
| 2005/0156654 A1 * | 7/2005 | Gaggl et al. | 327/337 |
| 2006/0049865 A1 * | 3/2006 | Keskin | 327/536 |

OTHER PUBLICATIONS

Abo, Andrew M. and Gray, Paul R., "A 1.5-V, 10-bit, 14.3-MS/s CMOS Pipeline Analog-to-Digital Converter," IEEE Journal of Solid-State Circuits, vol. 34, No. 5, May 1999, pp. 599-606.
Cho, Thomas Byunghak and Gray, Paul R., "A 10 b, 20 Msample/s, 35 mW Pipeline A/D Converter," IEEE Journal of Solid-State Circuits, vol. 30, No. 3, Mar. 1995, pp. 166-172.

(Continued)

*Primary Examiner*—Tuan T. Lam
*Assistant Examiner*—Hiep Nguyen
(74) *Attorney, Agent, or Firm*—Zagorin O'Brien Graham LLP

(57) ABSTRACT

A technique implements high impedance nodes using high threshold voltage devices that may generate less leakage current and may have a higher gate oxide breakdown voltage than standard devices in a particular manufacturing technology. Under at least one operating condition, for a particular power supply voltage, a circuit may be unable to produce a control signal that is sufficient to turn on such a high threshold voltage device. The technique adjusts the control signal voltage to provide a gate-to-source voltage sufficient to turn on the high threshold voltage device. At another power supply voltage, when the circuit is able to produce a control signal sufficient to turn on the high threshold voltage device, the technique does not adjust the control signal.

32 Claims, 9 Drawing Sheets

OTHER PUBLICATIONS

Favrat, Pierre, et al., "A High-Efficiency CMOS Voltage Doubler," IEEE Journal of Solid-State Circuits, vol. 33, No. 3, Mar. 1998, pp. 410-416.

Lim, Khee Yong and Zhou, Xing, "MOSFET Subthreshold Compact Modeling With Effective Gate Overdrive," IEEE Transactions on Electron Devices, vol. 49, No. 1, Jan. 2002, pp. 196-199.

Pylarinos, L., et al., "A Low-Voltage CMOS Filter for Hearing Aids using Dynamic Gate Biasing," IEEE Canadian Conf. on Elec. And Comp. Eng., Toronto, May 2001, pp. 0183-0188.

San, Hao, et al., "Highly-Efficient Low-Voltage-Operation Charge Pump Circuits Using Bootstrapped Gate Transfer Switches," T.IEE Japan, vol. 120-C, No. 10, 2000, pp. 1339-1345.

Wilson, Ron, "Leakage current leads 90-nm rogues' gallery," Electronic Engineering Times, May 19, 2003, www.EET.com, 4 pages.

Wu, Jieh-Tsorng, "MOS Charge Pumps for Low-Voltage Operation," IEEE Journal of Solid-State Circuits, vol. 33, No. 4, Apr. 1998, pp. 592-597.

* cited by examiner

UTILIZATION OF DEVICE TYPES HAVING DIFFERENT THRESHOLD VOLTAGES

CROSS-REFERENCE TO RELATED APPLICATION(S)

This application is related to application Ser. No. 11/172,446, filed Jun. 30, 2005, entitled "SELECTABLY BOOSTED CONTROL SIGNAL BASED ON SUPPLY VOLTAGE" naming Derrick Chunkai Wei as inventor, and issued as U.S. Pat. No. 7,199,641 on Apr. 3, 2007.

BACKGROUND

1. Field of the Invention

This invention relates to integrated circuits in general, and more particularly to applications sensitive to device leakage currents and/or device gate oxide breakdown voltages.

2. Description of the Related Art

As power supply voltages are being reduced for reduced-dimension CMOS process technologies, leakage currents may become detrimental to circuit operation. For example, a standard NMOS device (e.g., an NMOS device having a minimum thickness oxide for a particular process technology) in 0.13 μm CMOS technology leaks approximately 1 nA through the gate oxide under at least one process corner and under some operating conditions. In addition, a circuit designed in a particular process technology may be coupled to a power supply (i.e., a node held at a constant voltage and providing variable current) having one of at least two different allowable voltage levels. In such a circuit, at the allowable levels of the power supply voltage, if the gate-to-source voltage of a device in the circuit exceeds an associated gate oxide breakdown voltage level, the circuit may not operate properly. Accordingly, improved techniques for implementing integrated circuits using reduced-dimension CMOS processes and integrated circuits responsive to multiple allowable power supply voltage levels are desired.

SUMMARY

A technique for implementing high impedance nodes may be used in switched-capacitor circuits, variable capacitance RC filter circuits, or other circuits that may be substantially impacted by leakage current and/or sensitive to the gate oxide breakdown voltage. The technique uses high threshold voltage devices that generate less leakage current and have a higher gate oxide breakdown voltage than a standard device in a particular manufacturing technology. Under at least one operating condition, for a particular power supply voltage, a circuit may be unable to produce a control signal that is sufficient to turn on such a high threshold voltage device. The technique adjusts the control signal voltage to provide a gate-to-source voltage sufficient to turn on the high threshold voltage device. For another power supply voltage, when the circuit is able to produce a control signal sufficient to turn on the high threshold voltage device, the technique does not adjust the control signal.

In at least one embodiment of the invention, an apparatus includes a circuit portion including at least transistors of a first transistor type of a first conductivity type. The first transistor type has a first threshold voltage of an absolute value less than a power supply voltage operably coupled to the circuit over an allowable range of the power supply voltage. The apparatus includes at least one switch circuit for selectively coupling a respective first signal input/output node thereof to a respective second signal input/output node thereof. The switch circuit includes at least a transistor of a second transistor type, also of the first conductivity type. The second transistor type has a second threshold voltage higher in magnitude than the first threshold voltage. The switch circuit is responsive to at least a respective control signal having a first state and a second state. The control signal, in the first state, has a magnitude larger than the magnitude of the power supply voltage for at least some of the allowable range of the power supply voltage.

In at least one embodiment of the invention, a method includes implementing portions of a circuit using at least transistors of a first transistor type of a first conductivity type. The first transistor type has a first threshold voltage of an absolute value less than a power supply voltage operably coupled to the circuit over an allowable range of the power supply voltage. The method provides at least one switch circuit for selectively coupling a respective first signal input/output node thereof to a respective second signal input/output node thereof. The switch circuits include at least transistors of a second transistor type also of the first conductivity type. The second transistor type has a threshold voltage higher in magnitude than the first transistor type. The switch circuit is responsive to at least a respective control signal having a first state and a second state. The control signal, in one of the two states, has a magnitude larger than the magnitude of the power supply voltage for at least some of the allowable range of power supply values thereof. The method includes generating the control signal having an amplitude larger than the power supply voltage for at least some of the allowable range of power supply values thereof.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
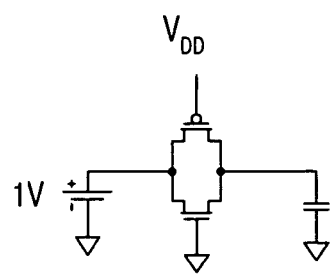
FIG. 1 illustrates an exemplary switch with leakage current.

Referring to FIG. 1, an exemplary switch includes an n-type device and a p-type device. If the switch is biased with 1V, the switch will leak approximately 60 nA under at least one set of process and operating conditions. Although the magnitude of the gate-to-source voltage ($V_{GS}$) may be less than the magnitude of the threshold voltage of an individual device in the switch, the individual device may be considered to be in a "subthreshold region" of operation instead of a "cutoff region" of operation.

Figure 2:
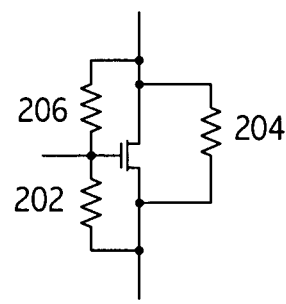
FIG. 2 illustrates a simple model for leakage paths of an n-type device of the exemplary switch of FIG. 1.

This phenomenon can be modeled for an individual n-type device as an ideal "off" device with a drain-to-source resistor 204 (FIG. 2). Gate leakage associated with gate-to-source resistor 202 and gate-to-drain resistor 206 are generally much greater than drain-to-source resistor 204 in the exemplary n-type device and may be ignored. In general, for the n-type device to be in an off state (e.g., the voltage at the drain of the device is effectively disassociated with the voltage at the source of the device for a specified operating speed of the circuit), the drain-to-source resistance should have a value in the order of megaohms. However, in a smaller geometry CMOS technology (e.g., a 0.13 µm technology), the drain-to-source resistance of an exemplary "off" device is typically in the order of kiloohms.

In an exemplary application, a circuit may be operated with a power supply voltage (i.e., $V_{DD}$, a voltage provided by a node that is held at a constant voltage and provides variable current) selected from more than one voltage level. A standard device in the exemplary process may have a gate oxide breakdown voltage that substantially exceeds a voltage applied across the gate of a device and another node of the device (e.g., gate-to-source voltage, gate-to-drain voltage, or gate-to-substrate voltage) applied to the device for one of the allowable voltage levels for $V_{DD}$, but not for another of the allowable voltage levels for $V_{DD}$. Thus, the circuit may not function properly for all allowable voltage levels for $V_{DD}$.

A technique for reducing leakage currents and/or sensitivity to a device gate oxide breakdown voltage in an exemplary circuit manufactured using an exemplary integrated circuit manufacturing process (e.g., circuit 301 of FIG. 3B) uses "thick oxide devices" instead of "standard devices". In general, thick oxide devices have a threshold voltage ($V_t$) magnitude greater than the magnitude of $V_t$ ($|V_t|$) of a standard device and have a gate oxide breakdown voltage greater than the gate oxide breakdown voltage of a standard device. As used herein, a device configuration is considered compatible with a particular $V_{DD}$ if a voltage applied across the gate of a device and another node of the device (e.g., gate-to-source voltage, gate-to-drain voltage, or gate-to-substrate voltage) is less than the gate oxide breakdown voltage of the device, reducing oxide reliability issues, and $V_{GS}$ applied to turn on the device in the device configuration substantially exceeds $|V_t|$ of the device when the device is to be configured in an 'on' state.

A single manufacturing process may provide both thick oxide devices and standard devices, however, a device configuration including the thick oxide devices and/or standard devices may not be compatible with a particular $V_{DD}$ of an allowable voltage range of power supplies. Accordingly, an integrated circuit may operate one way when a particular $V_{DD}$ of the allowable voltage range of the power supply is provided to the integrated circuit and operate another way when another $V_{DD}$ of the allowable voltage range of the power supply is provided to the integrated circuit.

For example, in an exemplary application, circuit 301 may be operated with control and/or data signals (e.g., CLKA and CLKB and IN, respectively) based on a $V_{DD}$ selected from approximately 3.3V, 2.5V, or 1.8V. A device configuration including a standard device in the exemplary process may not be compatible with all three power supply voltage levels (e.g., the breakdown voltage may not substantially exceed $V_{GS}$ applied to the standard device when $V_{DD}$ is approximately 3.3V although the threshold voltage is substantially less than $V_{GS}$ applied to standard devices to turn on the devices for all three power supply voltage levels). However, a device configuration including thick oxide devices in the exemplary process may not be compatible with all allowable power supply voltage levels for the circuit, (e.g., a device configuration including thick oxide devices may only be compatible with 2.5V and 3.3V power supplies and not a 1.8V power supply). When $V_{DD}$ is 1.8V, $V_{GS}$ applied to a thick oxide device to turn on the device may not substantially exceed $|V_t|$ of the thick oxide device. In at least one application, when operating in a low-voltage supply environment, $|V_t|$ of a thick oxide device may approach or even exceed $V_{DD}$. As $|V_t|$ of a thick oxide device approaches the applicable $V_{DD}$, typical switch implementations are presented with significant design challenges that are not typically addressed in standard device implementations. For example, insufficient gate-to-source overdrive (i.e., $V_{GS}$-$V_t$) may prevent a high control signal from turning on an n-type device, prevent a low control signal from turning on a p-type device, and/or produce a "dead zone" in a transmission gate transfer function, which impacts operation of switches in various applications. As used herein, a control signal is a digital signal having a high state and a low state and having an amplitude that is the voltage difference between a voltage level corresponding to the high state and a voltage level corresponding to the low state.

Figure 3A:
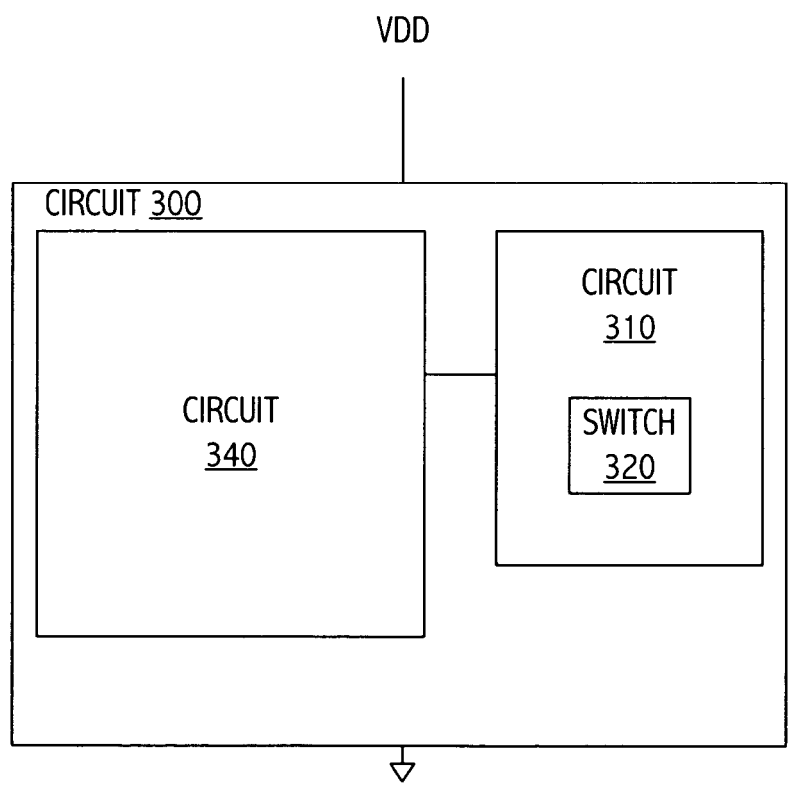
FIG. 3A illustrates a block diagram of an integrated circuit consistent with at least one embodiment of the present invention.

Referring to FIG. 3A, integrated circuit 300, consistent with at least one embodiment of the present invention, includes circuit 340 and circuit 310, which includes switch 320. Switch 320 includes at least one thick oxide device. The $V_t$ of the thick oxide device has an absolute value greater than the $V_t$ of a standard device. Standard devices are generally faster and smaller than thick oxide devices. Accordingly, integrated circuit 300 includes standard devices at least in circuit 340. Circuit 310 implements an application sensitive to leakage current of at least one device, e.g., a device in switch 320, and/or sensitive to the gate oxide breakdown voltage of the device. The entire circuit 310 or only a portion of circuit 310 may be implemented with thick oxide devices and any other devices may be implemented with standard devices.

Figure 3B:
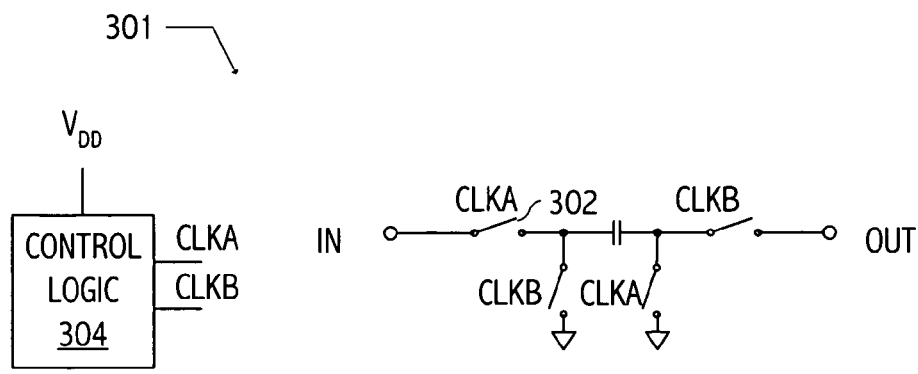
FIG. 3B illustrates an exemplary switched-capacitor circuit.
Figure 4:
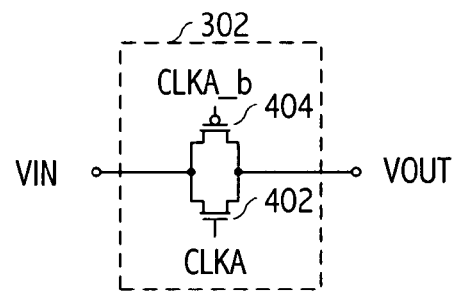
FIG. 4 illustrates an exemplary switch of the switched-capacitor circuit of FIG. 3.
Figure 5A:
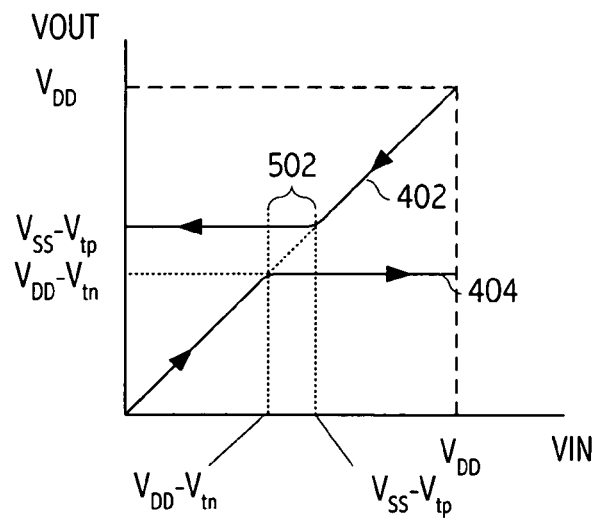
FIG. 5A illustrates a transfer curve for the exemplary switch of FIG. 4.

Referring to FIGS. 3B, 4 and 5A, circuit 301 is an exemplary switched capacitor circuit controlled by complementary clocks CLKA and CLKB generated by control logic 304 to capacitively couple nodes IN and OUT. Circuit 301 may be included in circuit 310 of FIG. 3A as a switched capacitor sampler circuit, e.g., switched capacitor sampler circuits described in U.S. patent application Ser. No. 11/003,288 entitled "Switched Capacitor Sampler Circuit and Method Therefor", filed Dec. 3, 2004, naming Derrick Chunkai Wei as inventor and U.S. patent application Ser. No. 11/004,387 entitled "Switched Capacitor Input Circuit and Method Therefor", filed Dec. 3, 2004, naming Derrick Chunkai Wei as inventor, which applications are incorporated herein by reference. Switch 302 selectively couples node VIN to VOUT and may be implemented as a transmission gate including n-type device 402 and p-type device 404 having exemplary threshold voltages, $V_{tn}$ of 1V and $V_{tp}$ of −1V. Voltage VIN is an analog signal, which may vary between ground and $V_{DD}$, inclusively (i.e., rail-to-rail) or other voltage range including $V_{DD}$-$V_{tn}$ and/or $V_{SS}$-$V_{tp}$.

FIG. 5A illustrates a transfer function (i.e., VOUT vs. VIN) of a transmission gate (e.g., switch 302) including a device configuration incompatible with a particular $V_{DD}$ and receiving a control signal in a high state equal to such $V_{DD}$. When $V_{DD}$ is approximately 1.8V and CLKA is high and CLKA_b is low (i.e., CLKA is approximately $V_{DD}$, CLKA_b is approximately $V_{SS}$, and the switch is closed), for n-type device 402, as VIN increases from ground to $V_{DD}$-$V_{tn}$ (e.g., voltage VIN<0.8V), the n-type device 402 remains on and the gain (i.e., VOUT/VIN) of switch 302 equals approximately one. When VIN exceeds approximately $V_{DD}$-$V_{tn}$, n-type device 402 turns off so VOUT remains at $V_{DD}$-$V_{tn}$. As VIN decreases from $V_{DD}$ to $V_{SS}$-$V_{tp}$, p-type device 404 remains on and the gain of switch 302 equals approximately one. When VIN exceeds approximately $V_{SS}$-$V_{tp}$ (e.g., 1.0V), p-type device 404 turns off, so VOUT remains at $V_{SS}$-$V_{tp}$. As a result, the transfer function of switch 302 includes dead zone 502 where the gain is zero because neither n-type device 402 nor the p-type device 404 is on, i.e., the switch is open although CLKA is high.

Dead zone 502 is a discontinuity in the transfer function that occurs because $V_{DD}$-$V_{tn}$ is less than $V_{SS}$-$V_{tp}$, i.e., $V_{DD}$-$V_{SS}$<$V_{tn}$-$V_{tp}$. A dead zone typically does not occur under those operating conditions in a transfer function of a transmission gate including devices in a configuration compatible with the particular $V_{DD}$ because in such a transmission gate, $V_{DD}$-$V_{tn}$ is greater than or equal to $V_{SS}$-$V_{tp}$. In addition, a region of a transfer function where a switch including thick oxide devices does not transfer charge to VOUT although a control signal level for closing the switch is applied to the switch may occur in switches of a single conductivity type (i.e., switches including device(s) of only one conductivity type) if VIN is allowed to be in the range VIN<$V_{SS}$-$V_{tp}$ for a switch including a p-type device, or if VIN is allowed to be in the range VIN>$V_{DD}$-$V_{tn}$ for a switch including an n-type device. However, a transfer function for those switches implemented with standard devices receiving a control signal level for closing the switch may not include such a region for the same values of VIN.

Figure 5B:
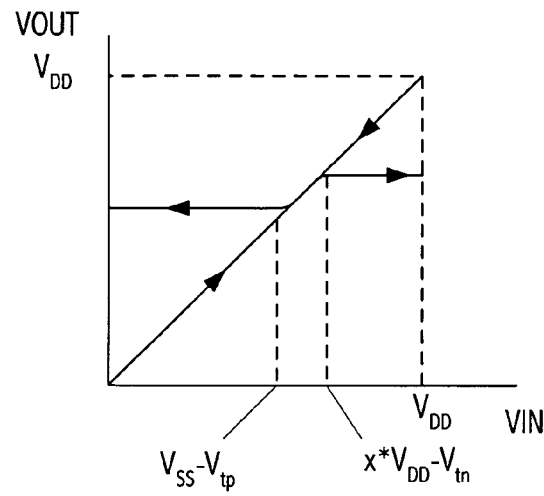
FIG. 5B illustrates a transfer curve for the exemplary switch of FIG. 4 responsive to a boosted control signal consistent with at least one embodiment of the present invention.

A technique for closing a switch using thick oxide devices in the low voltage environment (e.g., switch 302), increases the high level of a switch control signal (e.g., CLKA) above $V_{DD}$. This technique improves static characteristics associated with the switch. For example, a transfer function (FIG. 5B) associated with the switch receiving a control signal level for closing the switch using thick oxide devices becomes continuous for the input range and has a gain of approximately one for the input range when the voltage level for the control signal that closes the switch (e.g., high) is boosted above $V_{DD}$.

Figure 6:
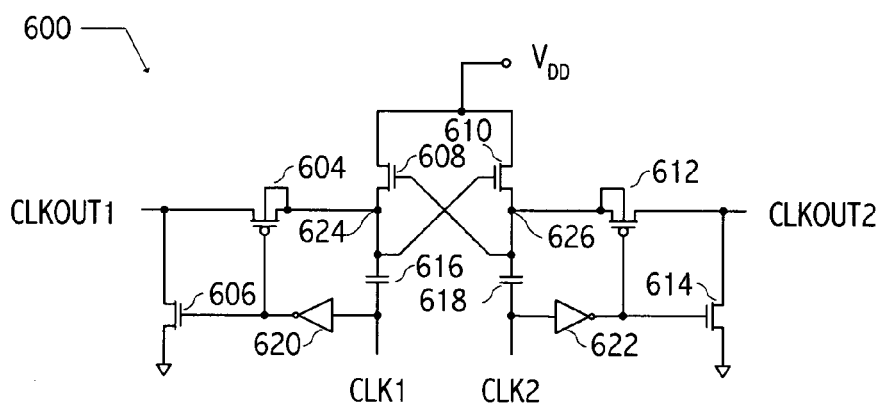
FIG. 6 illustrates a clock voltage level boosting circuit consistent with at least one embodiment of the present invention.

One technique for increasing a level of a switch control signal above $V_{DD}$ includes implementing $V_{DD}$ as a charge-pump regulator (e.g., a Dickson charge pump) for supplying $V_{DD}$ to a clock driver which supplies the control signal to the switch. A typical charge pump regulator and clock driver may not be suitable to increase a high state of CLKA above $V_{DD}$ for a sample and hold application because the typical charge pump regulator may have limited speed, introduce substantial noise, use a substantial amount of power, and occupy a substantial area on an integrated circuit. In at least one approach for generating a control signal, a clock driver supplies CLKA based on a power supply voltage level greater than $V_{DD}$ supplied by a static voltage reference. Such a static voltage reference includes a charge pump which uses less power and occupies less area on an integrated circuit than a charge-pump regulator, but a static voltage reference circuit typically has a high output impedance and cannot deliver charge at a rate sufficient for the clock driver to supply the control signal to a switched capacitor circuit. Instead, a circuit suitable for increasing a voltage level above $V_{DD}$ for a high state of the control signal increases the voltage of control signal within a clock driver to sufficiently drive the switches in the switched capacitor circuit (FIG. 6). The circuit is fast enough to provide the necessary voltage and generally uses less power and occupies less integrated circuit area than a typical charge pump regulator.

Figure 7:
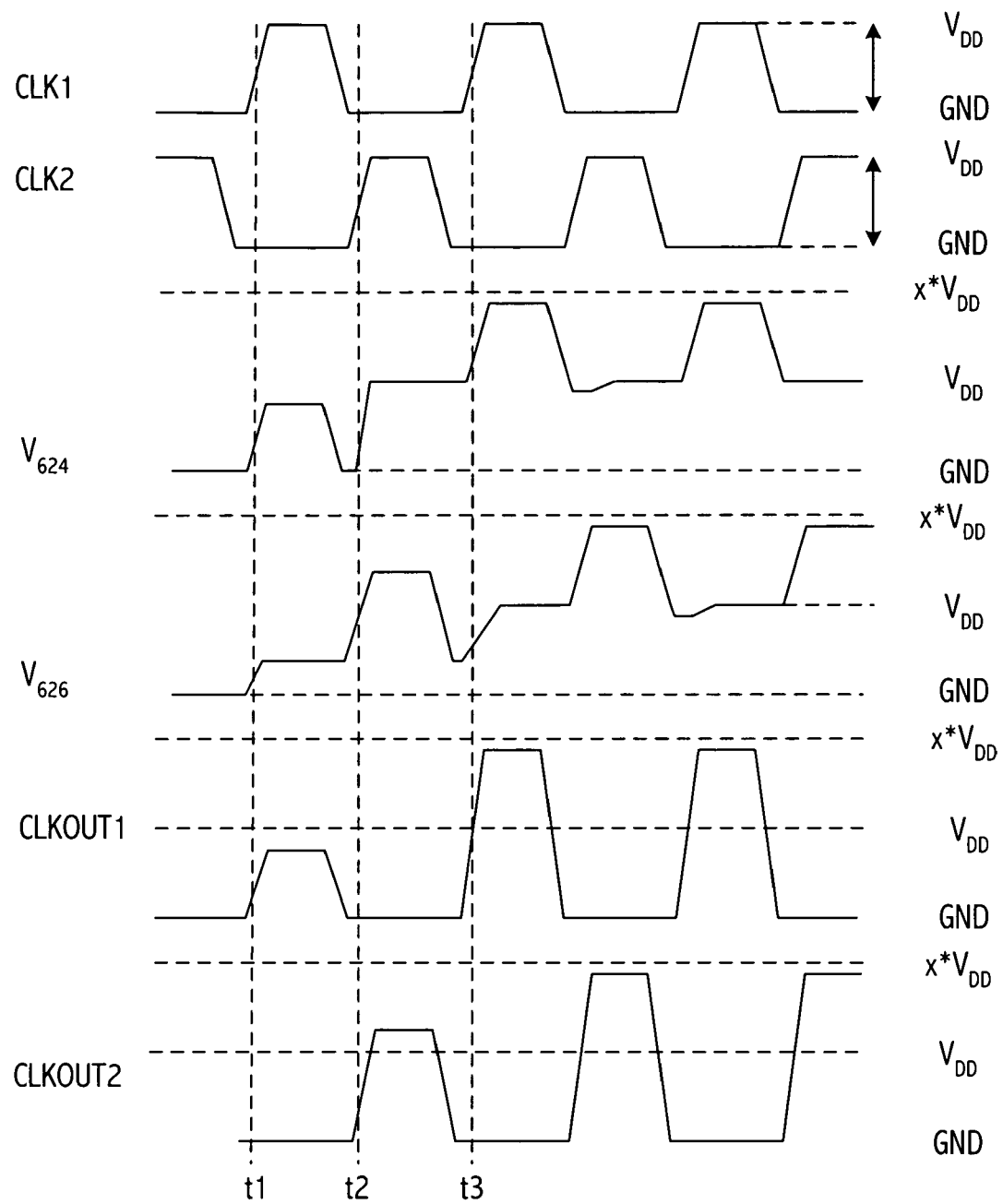
FIG. 7 illustrates timing signals for the clock voltage level boosting circuit of FIG. 6 consistent with at least one embodiment of the present invention.

Referring to FIG. 6 and FIG. 7, an exemplary charge pump (e.g., clock voltage level boosting circuit 600) charges nodes 624 and 626 to approximately twice the high voltages (i.e., $V_{DD}$) of complementary, non-overlapping clock signals, clock CLK1 and clock CLK2. At power up, assuming that no charge is stored on capacitors 616 or 618, when clock CLK1 transitions from low to high at time t1, CLK2 is low, node 624 is capacitively coupled to a voltage level almost as high as the high level of CLK1 and device 610 is turned on. Note that node 624 is not charged to $V_{DD}$ because of stray capacitance on node 624. Capacitor 618 is initially charged to approximately $V_{DD}$-$V_{tn}$, then higher in subsequent pulses. When clock CLK1 transitions low and clock CLK2 transitions from low to high at time t2, node 626 is boosted by the transitions of CLK2 to a level well above $V_{DD}$. Device 608 is turned on, charging node 624 to approximately $V_{DD}$ and capacitor 616 is charged to approximately $V_{DD}$. When clock CLK1 transitions again from low to high at time t3, node 624 is boosted to approximately 2*$V_{DD}$ (actually, somewhat less, as described below). As shown in FIG. 7, steady-state operation of clock voltage level boosting circuit 600 is reached at time t3, after two clock cycles. However, an exemplary clock voltage level boosting circuit 600 achieves steady state operation after an additional number clock cycles, which may vary according to values of capacitors 616 and 618 and according to load capacitance (e.g., $C_{LOAD}$, not shown).

The phases of clocks CLK1 and CLK2 are arranged to pass the boosted voltages, $V_{624}$ and $V_{626}$, to respective outputs CLKOUT1 and CLKOUT2 during respective high states of CLKOUT1 and CLKOUT2. P-type devices 604 and 612 pass the boosted voltage $x*V_{DD}$ (e.g., approximately $2*V_{DD}$) to the outputs CLKOUT1 and CLKOUT2, respectively. When clock CLK1 transitions high, voltage $V_{624}$ is boosted above $V_{DD}$ and the output of inverter 620 transitions low. The low output of inverter 620 turns on device 604 and turns off device 606 to drive the output CLKOUT1 from ground to $x*V_{DD}$. The voltage level $x*V_{DD}$ is not $2*V_{DD}$ because of charge sharing between parasitic capacitance on CLKOUT1 and node 624 and capacitor 616. The bulk of device 604 is coupled to node 624 to prevent forward biasing of the source-to-n-well junction. The charge necessary to drive CLKOUT1 from ground to $x*V_{DD}$ is essentially entirely provided by capacitor 616, while charge is refreshed when CLK1 transitions low.

When clock CLK1 transitions from high to low, voltage $V_{624}$ is capacitively coupled by capacitor 616 down to $V_{DD}$ and the output of inverter 620 transitions high. The high output of inverter 620 turns off device 604 and turns on device 606 which discharges output CLKOUT1 to ground. When CLK1 transitions from high to low, device 606 may turn on fast enough to partially discharge capacitor 616 before device 604 turns off. Thus, voltage $V_{624}$ may discharge to a voltage level less than $V_{DD}$, depending on the speed of inverter 620 and the threshold voltages of devices 606 and 604. In addition, the voltage of node 624 will also be less than $V_{DD}$ because of the charge provided by capacitor 616 to drive the CLKOUT1 high. However, when clock CLK2 transitions high, the voltage across capacitor 616 will be refreshed to $V_{DD}$ when device 608 turns on, so that during the next cycle (i.e., when clock CLK1 transitions from low to high), the output CLKOUT1 will be $x*V_{DD}$.

Figure 8:
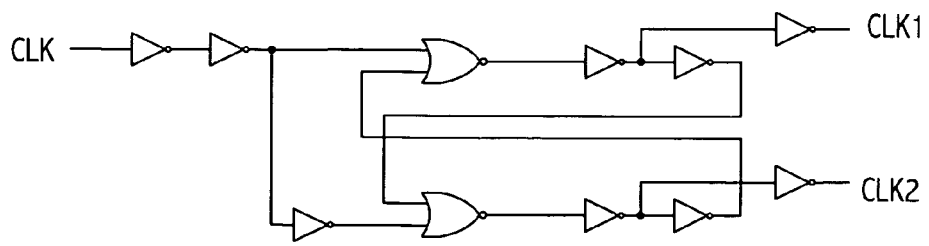
FIG. 8 illustrates a circuit diagram of a non-overlapping clock generator consistent with at least one embodiment of the present invention.

If CLK1 and CLK2 are overlapping clocks, devices 610 and 608 turn on during the overlapped portion(s) of CLK2 and CLK1. The boosted voltage on node 624 and node 626 will discharge through device 608 and 610, respectively, to the power supply during the overlapped portions of CLK1 and CLK2 to degrade the boosted level of CLKOUT1 and CLKOUT2, respectively. In at least one embodiment of the invention, clocks CLK1 and CLK2 are non-overlapping clocks to reduce this leakage current from capacitors 616 and 618 through devices 608 and 610 to the power supply, and maintain charge on capacitors 616 and 618. Clocks CLK1 and CLK2 may be generated by non-overlapping clock generator 900 (FIG. 8), which may also be implemented using NAND gates or by any other suitable circuit.

The actual "high" level $x*V_{DD}$ (e.g., approximately $2*V_{DD}$) and the output voltages for CLKOUT1 and CLKOUT2 depend on capacitors 616 and 618, respectively and the load capacitance on OUTCLK1 and OUTCLK2. A relationship can be derived using charge conservation principles. Assuming that the load capacitance dominates other capacitances (e.g., the off, gate-to-drain capacitance of device 606, the on, gate-to-drain capacitance of device 604, the off, gate-to-source capacitance of device 608, the bulk capacitance of device 604, and the gate-to-source capacitance of device 604), then capacitor 616 may be chosen according to the following relationship:

$$V_{CLKOUT1} = \frac{2*V_{DD}}{1 + \frac{C_{LOAD}}{C_{616}}}$$

Therefore, if capacitor 616=$C_{LOAD}$, voltage $V_{CLKOUT1}$=$V_{DD}$ and no boosting occurs. In at least one embodiment of the invention, $C_{LOAD}$ is 20 fF, capacitor 616 is chosen to be greater than approximately 100 fF which makes $C_{LOAD}/C_{616}$ approximately 20%, and the boosted clock high level is approximately $1.67*V_{DD}$ (e.g., $V_{DD}$=1.8V and CLKOUT1 varies between 0V and approximately 3V, a voltage level having a magnitude larger than $V_{DD}$ and large enough to turn on thick oxide devices in an associated switch).

Figure 9:
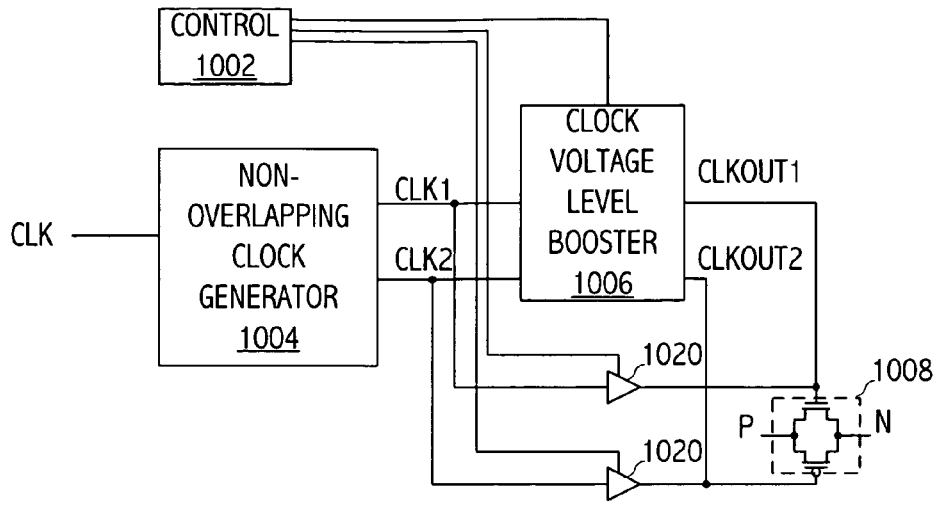
FIG. 9 illustrates a block diagram of a circuit including a control signal adjusted according to a supply voltage consistent with at least one embodiment of the present invention.

Referring to FIG. 9, in an exemplary application, non-overlapping clock generator 1004 is coupled to clock voltage level boosting circuit 1006 (e.g., clock voltage level boosting circuit 600), which is coupled to a switch (e.g., switch 1008) coupling signal input/output node P to signal output/input node N. Control circuit 1002 controls clock voltage level boosting circuit 1006 and enables tri-state buffers 1020 based on the voltage level of $V_{DD}$, which may be determined by a voltage level sensor (e.g., a circuit that compares an external power supply voltage to a reference voltage generated by a bandgap voltage reference circuit or other suitable on-chip voltage reference circuit), or other suitable technique. For example, when the power supply is 2.5V or 3.3V, tristate buffers 1020 are enabled, clock voltage level booster circuit 1006 is disabled, and switch 1008 receives clocks CLK1 and CLK2, which vary between ground and $V_{DD}$. When $V_{DD}$ is 1.8V, tristate buffers 1020 are disabled, clock voltage level booster 1006 is enabled and switch 1008 receives CLKOUT1 and CLKOUT2 which vary between ground and a boosted supply voltage, $x*V_{DD}$ (e.g., 3.0V).

Figure 10:
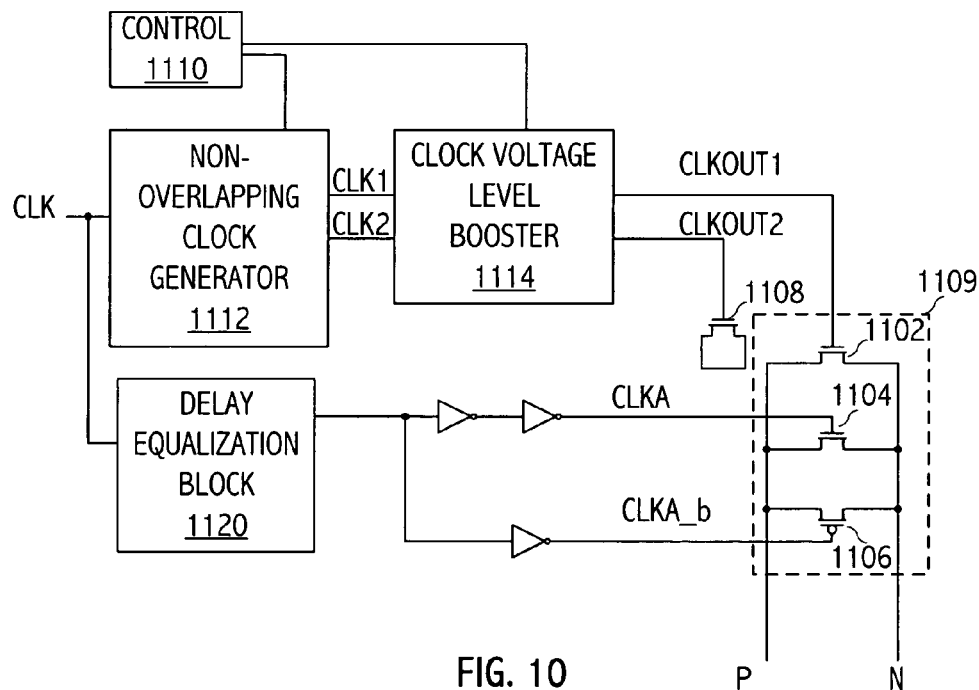
FIG. 10 illustrates a block diagram of a circuit including a control signal adjusted according to a supply voltage consistent with at least one embodiment of the present invention.

In at least one embodiment of the invention, only an n-type device of a switch receives a clock boosted according to the supply voltage. Referring to FIG. 10, a switch (e.g., switch 1109) coupling signal input/output node P to signal output/input node N is implemented with two n-type devices (e.g., n-type device 1102 and n-type device 1104) and a p-type device (e.g., p-type device 1106). When the power supply is 2.5V or 3.3V, control circuit 1110 disables non-overlapping clock generator 1112 and clock voltage level boosting circuit 1114, which disables n-type device 1102. Non-overlapping clock generator 1112 and clock voltage level boosting circuit 1114 are disabled, e.g., by uncoupling power to non-overlapping clock generator 1112 to disable clocks CLK1 and CLK2. Delay equalization block 1120 delays clock signal CLK by an amount that accounts for a delay introduced by non-overlapping clock generator 1112, thus reducing differences in arrival times of control signals at switch 1109.

N-type device 1104 receives clock CLKA and p-type device 1106 receives complementary clock CLKA_b, which vary between ground and $V_{DD}$. When the power supply is 1.8V, n-type device 1104 continues to receive clock CLKA and p-type device 1106 continues to receive clock CLKA_b, which vary between ground and $V_{DD}$. However, control circuit 1110 enables non-overlapping clock generator 1112 and clock voltage level boosting circuit 1114. N-type device 1102 receives clock CLKOUT1, which varies between ground and a boosted supply voltage, $x*V_{DD}$ (e.g., 3.0V), and turns on n-type device 1102 when clock CLK is high. Accordingly, when clock CLK is high, an analog signal that may vary from rail-to-rail is transferred from node P to N for the entire voltage range of the analog signal, and switch 1109 has the transfer function shown in FIG. 5B. In at least one embodiment of the invention, device 1108 is coupled to clock CLKOUT2 to balance loading on the outputs of clock voltage level boosting circuit 1114. Device 1108 may represent another switch (analogous to switch 1109) that is clocked by a complementary clock CLKOUT2.

Although FIG. 9 and FIG. 10 illustrate selectably boosting signals to a transmission gate in switch 1008 and to an n-type device in switch 1109, respectively, the techniques described herein are not limited thereto and may be adapted for use with any suitable switch configuration, e.g., switches including devices of a single conductivity type, switches including different combinations of devices of different conductivities, and switches including multiple devices having different respective threshold voltages. In addition, the invention contemplates boosting the low level of a control signal below $V_{SS}$ or otherwise adjusting voltage levels of control signals according to switch configurations and associated power supply environments.

Figure 11:
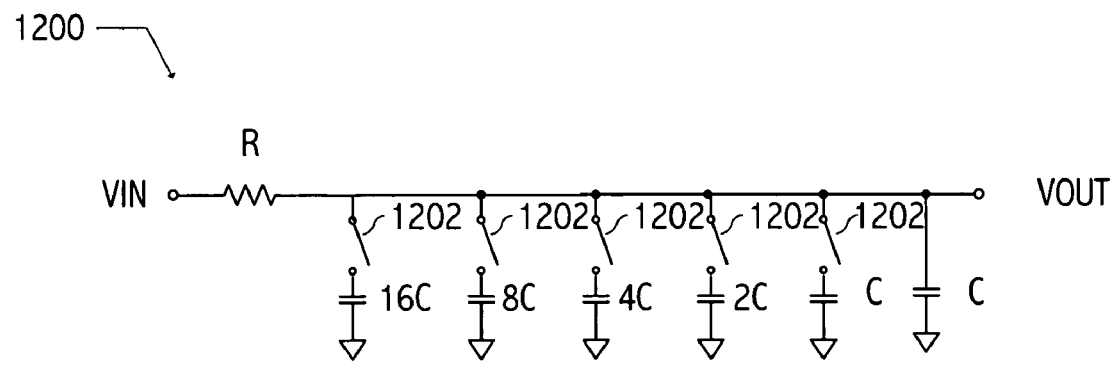
FIG. 11 illustrates a filter circuit consistent with at least one embodiment of the present invention.
Figure 12:
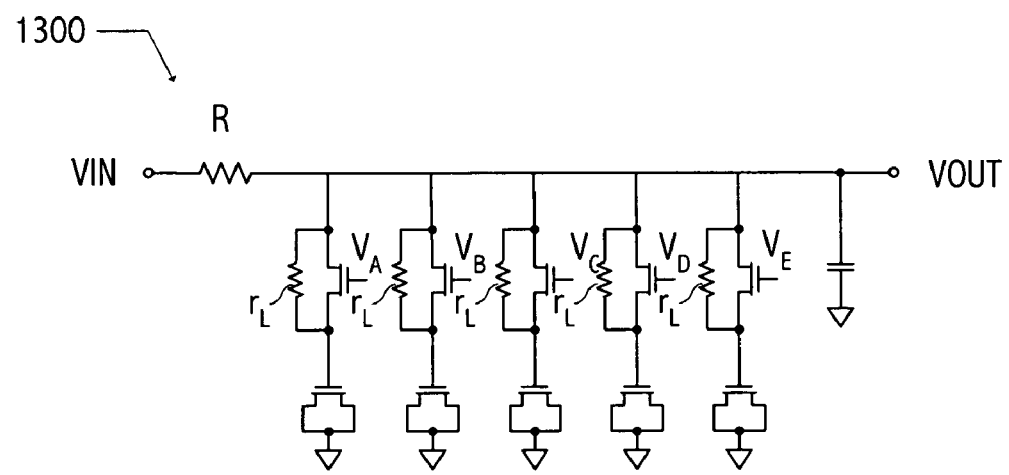
FIG. 12 illustrates a model of the filter circuit of FIG. 11 with non-ideal switches.
Figure 13:
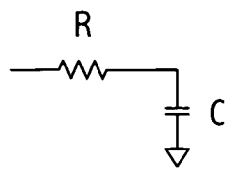
FIG. 13 illustrates a model of the filter circuit of FIG. 11 with ideal switches.
Figure 14:
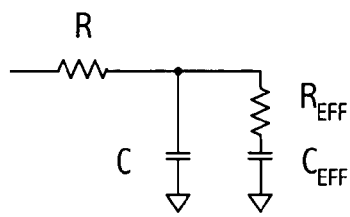
FIG. 14 illustrates a model of the filter circuit of FIG. 11 with non-ideal switches.
Figure 15:
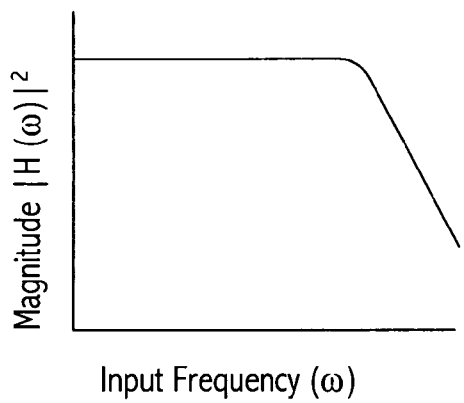
FIG. 15 illustrates a frequency response of the circuit of FIG. 11 with ideal switches.
Figure 16:
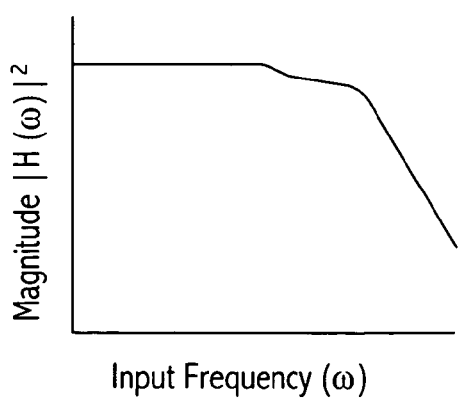
FIG. 16 illustrates a frequency response of the circuit of FIG. 11 with non-ideal switches.

Referring now to another application, a variable RC filter circuit may include a variable resistance and/or a variable capacitance configured by switches and corresponding control signals. For example, a variable capacitance may be included in a loop filter of a phase-locked loop or a varactor array of a voltage controlled oscillator such as in the circuits described in U.S. Pat. No. 6,825,785 entitled "Digital Expander Apparatus and Method For Generating Multiple Analog Control Signals Particularly Useful for Controlling a Sub-Varactor Array of a Voltage Controlled Oscillator", issued Nov. 30, 2004, naming Yunteng Huang and Bruno W. Garlepp as inventors, which patent is incorporated herein by reference. In at least one embodiment of the present invention, a variable capacitance is implemented using standard n-type devices as switches, as illustrated in FIG. 11. Variable RC filter 1200 may be modeled as RC filter 1300 (FIG. 12) including a leakage resistance ($r_L$) of the off switch, as discussed above. When all switches of RC filter 1200 are configured to be open (i.e., devices 1202 are in an off configuration), an ideal switch 1202 would produce the effective circuit illustrated in FIG. 13, having a frequency response with one pole, as illustrated in FIG. 15. However, switches 1202 are non-ideal (i.e., switches 1202 have leakage currents) and produce the effective circuit illustrated in FIG. 14. The effective leakage resistance, $R_{EFF}$, which is a function of $r_L$, and effective capacitance, $C_{EFF}$, impact the frequency response by introducing a zero at a frequency that is a function of the number of selectable capacitances in the off-state and the capacitance value, as illustrated in FIG. 16. Such a pole-zero effect may be unacceptable in some applications.

The leakage currents of switches 1202 of FIG. 11 may be reduced by implementing switches 1202 with thick oxide devices instead of standard devices. Consequently, similar to the implementation of the switched capacitor circuit of FIG. 3B, the analog voltage $V_{IN}$ over a range from power to ground and control signals of the selectable capacitance in the RC filter may vary (e.g., control signals $V_A$, $V_B$, $V_C$, $V_D$, and $V_E$) and may provide insufficient gate-to-source overdrive to turn on switches 1202 in power supply environments incompatible with switches including thick oxide devices. However, contrary to the switched capacitor circuit of FIG. 3B, control signals $V_A$, $V_B$, ..., $V_E$ may not switch as frequently as the sample and hold control signals of switched capacitor circuit 301. Accordingly, $V_{DD}$ may be boosted to provide a voltage reference for boosting the individual control signals using a level shifting buffer.

Figure 17:
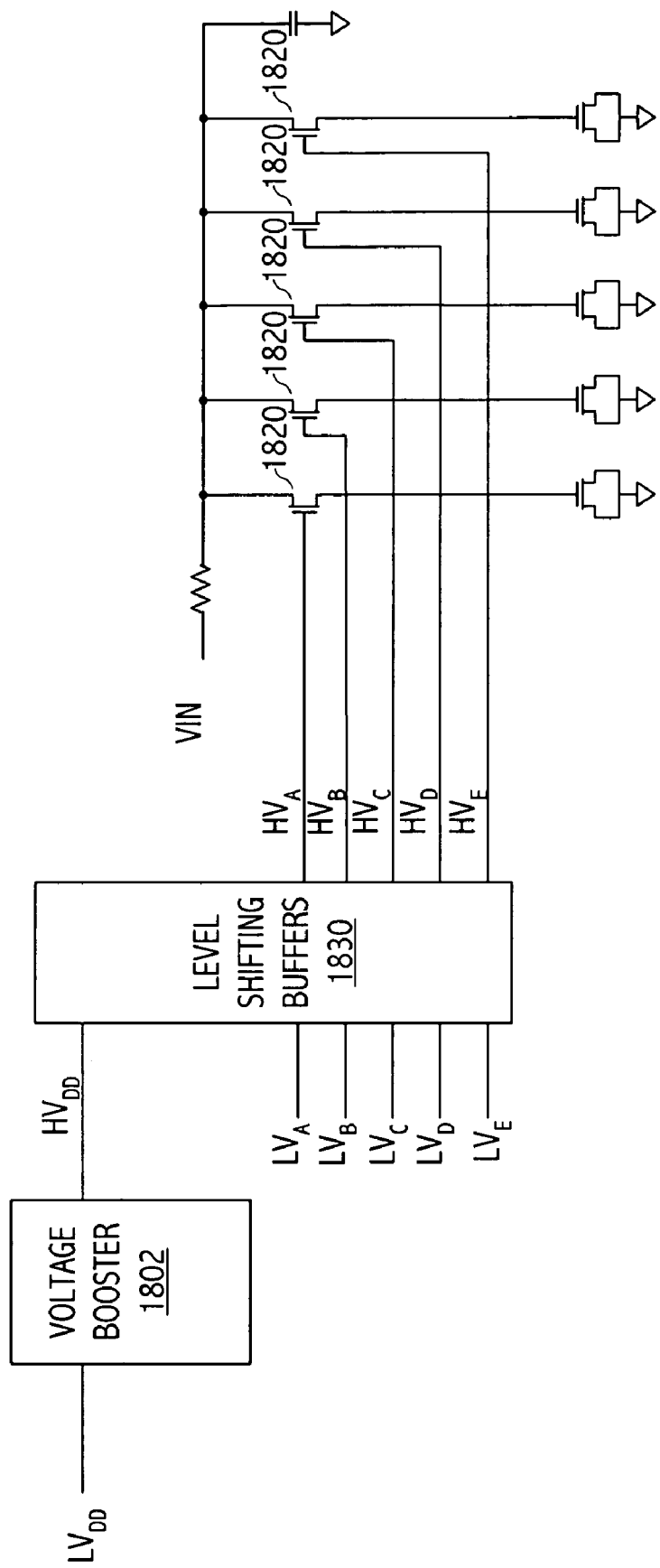
FIG. 17 illustrates a block diagram of a circuit including a filter and control circuits consistent with at least one embodiment of the present invention.
Figure 18:
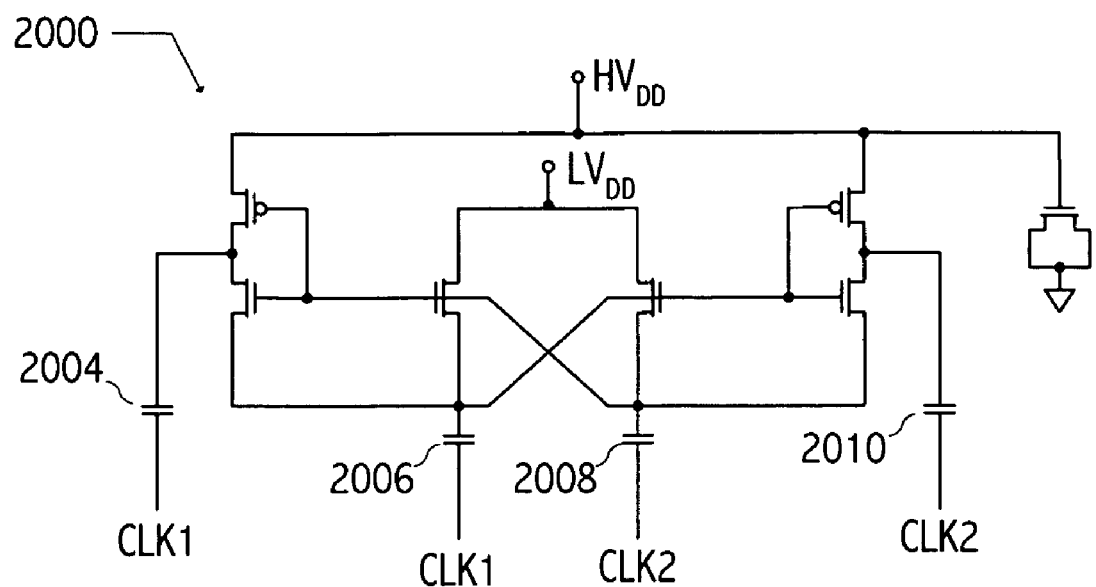
FIG. 18 illustrates a circuit diagram of a voltage boosting circuit consistent with at least one embodiment of the present invention.
Figure 19:
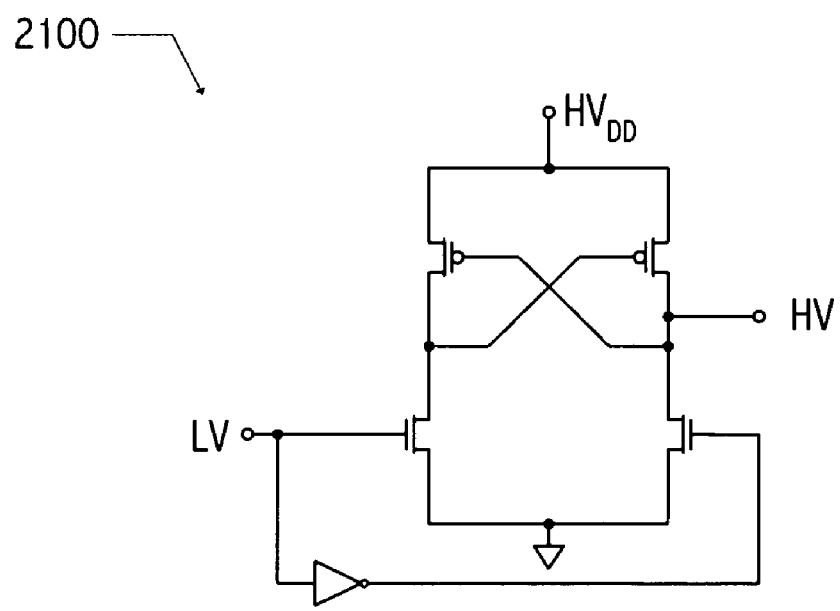
FIG. 19 illustrates a circuit diagram of a level shifting buffer consistent with at least one embodiment of the present invention.

Referring to FIGS. 17-19, in at least one embodiment of the invention, voltage booster circuit 1802 (e.g., voltage boosting circuit 2000 of FIG. 18) provides a boosted power supply voltage (e.g., power supply voltage $HV_{DD}$) based on a power supply voltage (e.g., power supply voltage $LV_{DD}$). In an exemplary embodiment, the boosted power supply voltage is approximately twice $V_{DD}$ (i.e., $HV_{DD}=2*LV_{DD}$). However, the boosted power supply level depends on at least a load capacitance and capacitors 2004 and 2010. $V_{DD}$ may be multiplied by other suitable multipliers (e.g., by appropriately sizing capacitors 2004, 2006, ... 2010 of voltage boosting circuit 2000). Other circuit configurations may provide boosted power supply voltages based on varying input clock voltage levels, varying voltage reference levels, or other suitable techniques. Level shifting buffers 1830 (e.g., multiple ones of level shifting buffer 2100 of FIG. 19) receive the boosted power supply voltage $HV_{DD}$ and low voltage control signals $LV_A$, $LV_B$, ..., $LV_E$ to provide high voltage control signals $HV_A$, $HV_B$, ..., $HV_E$ to switches 1820 which include at least one thick oxide device. Voltage boosting circuit 2000 and level shifting buffer 2100 are exemplary and other voltage boosting circuits, level shifting buffers, or other techniques for shifting voltage levels of control signals may be used.

Referring to FIG. 17, although switches 1820 are illustrated as n-type devices, in at least one embodiment of the present invention, switches 1820 are implemented with transmission gates including an n-type device and a p-type device, or other device configurations that include at least one thick oxide device (e.g., a thick oxide p-type device and/or a thick oxide n-type device). At an exemplary power supply voltage level, control signals $LV_A$, $LV_B$, ..., $LV_E$ provide insufficient gate-to-source overdrive to turn on a thick oxide p-type device and/or turn-on a thick oxide n-type device included in switches 1820. Accordingly, level shifting buffers 1830 may generate corresponding control voltages that vary between suitable voltages, e.g., a high voltage level boosted to $x*V_{DD}$ or a high voltage level boosted to $-x*V_{DD}$, where x is a suitable multiplier for a circuit implemented in CMOS or other suitable technology. In addition, control signals coupled to devices 1820 may be selected from a shifted control voltage and a nonshifted control voltage, according to $V_{DD}$ as described with reference to FIG. 9 and FIG. 10. The low voltage level of the control signal may not necessarily be ground, but may be shifted consistent with the invention.

While circuits and physical structures are generally presumed, it is well recognized that in modern semiconductor design and fabrication, physical structures and circuits may be embodied in computer readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The description of the invention set forth herein is illustrative and is not intended to limit the scope of the invention as set forth in the following claims. Although the invention is described with reference to thick oxide devices, the invention is contemplated to include using other suitable devices having a $V_t$ greater than the $V_t$ of a standard device instead of thick oxide devices. Although the invention is described with reference to raising control voltages above a power supply voltage to sufficiently turn on n-type devices, techniques described herein may be applied to boosting control voltages below ground to sufficiently turn on p-type devices in a low voltage environment. Furthermore, variations and modifications of the embodiments disclosed herein may be made based on the foregoing description without departing from the scope and spirit of the invention as set forth in the following claims.

What is claimed is:

1. An integrated circuit comprising:
    a circuit portion comprising transistors of a first transistor type of a first conductivity type, the first transistor type having a first threshold voltage of an absolute value less than a power supply voltage of the integrated circuit operably coupled to the circuit portion over an allowable range of the power supply voltage; and
    at least one switch circuit for selectively coupling a first node thereof to a second node thereof, the switch circuit comprising at least a transistor of a second transistor type, and of the first conductivity type, the second transistor type having a second threshold voltage higher in magnitude than the first threshold voltage, the switch circuit being responsive to at least a control signal having a first state and a second state,
    wherein the control signal has approximately a ground voltage during the first state and a first voltage level during the second state, the first voltage level being approximately the power supply voltage for at least some of the allowable range of the power supply voltage and the first voltage level being approximately the voltage greater than the power supply voltage for at least some of the allowable range of the power supply voltage.

2. The integrated circuit, as recited in claim 1, wherein the transistor of the second transistor type has an oxide thickness greater than an oxide thickness of the transistors of the first transistor type.

3. The integrated circuit, as recited in claim 1, wherein the transistor of the second transistor type has a lower leakage current than the transistors of the first transistor type.

4. The integrated circuit, as recited in claim 1, wherein a breakdown voltage of the second transistor type is substantially greater than the magnitude of the first state of the control signal for the allowable range of power supply voltage.

5. The integrated circuit, as recited in claim 1, wherein the second threshold voltage has an absolute value of at least the magnitude of the power supply voltage for at least some of the allowable range of the power supply voltage.

6. The integrated circuit, as recited in claim 1, further comprising:
    a voltage shifting circuit configured to provide the control signal to the switch circuit.

7. The integrated circuit, as recited in claim 1, wherein the switch circuit forms a portion of a variable RC filter circuit.

8. The integrated circuit, as recited in claim 7, wherein the switch circuit is coupled in series with a capacitor and coupled in parallel with at least an additional switch coupled to an additional capacitor.

9. The integrated circuit, as recited in claim 1, wherein the switch circuit forms a portion of a varactor circuit.

10. The integrated circuit, as recited in claim 1, further comprising:
    at least an additional switch coupled to the switch circuit, the additional switch being responsive to at least a second control signal, the second control signal having a first state and a second state, the second control signal, in the first state, having a magnitude no larger than the power supply voltage.

11. The integrated circuit, as recited in claim 10, wherein the additional switch comprises a transistor having a conductivity type opposite the first conductivity type.

12. The integrated circuit, as recited in claim 6, wherein the control signal is one of a pair of clock signals provided by the voltage shifting circuit, individual ones of the clock signals having an amplitude larger than the power supply voltage.

13. The integrated circuit, as recited in claim 12, wherein the voltage shifting circuit comprises:
    a first input node and a second input node responsive to respective ones of a first pair of non-overlapping clock signals having a first voltage level in respective first phases and a second voltage level in respective second phases;
    a first node and a second node configured to provide a second pair of non-overlapping clock signals having the second voltage level in respective first phases and a third voltage level in respective second phases;
    a first output stage and a second output stage responsive to at least respective ones of the first and second input nodes and responsive to at least respective ones of the first and second nodes and configured to provide the pair of clock signals provided by the voltage shifting circuit having the first voltage level in respective first phases and the third voltage level in respective second phases; and
    wherein the first voltage level is the ground voltage, the second voltage level is the power supply voltage, and the third voltage level has a magnitude larger than the power supply voltage.

14. The integrated circuit, as recited in claim 13, wherein individual ones of the pair of output stages comprise:
    a first inverter circuit responsive to at least the power supply voltage, the ground voltage, and a respective one of the first and second input nodes; and
    a second inverter circuit responsive to at least a respective one of the first and second nodes, a ground voltage, and an output of the first inverter circuit.

15. The integrated circuit, as recited in claim 1, wherein the at least one switch forms a portion of a switched capacitor circuit.

16. The integrated circuit, as recited in claim 1, embodied in computer readable descriptive form suitable for use in design, test, or fabrication of an integrated circuit.

17. An apparatus comprising:
    a circuit means comprising transistors of a first transistor type of a first conductivity type, the first transistor type having a first threshold voltage of an absolute value less than a power supply voltage operably coupled to the circuit over an allowable range of the power supply voltage; and
    means for selectively coupling a first node to a second node, the means for selectively coupling comprising transistors of a second transistor type and of the first conductivity type, the second transistor type having a second threshold voltage of an absolute value higher in magnitude than the threshold voltage of the first transistor type, wherein the circuit means and the means for selectively coupling are on the same integrated circuit, wherein a control signal of the means for selectively coupling has approximately a ground voltage during a first state of the control signal and a first voltage level during a second state of the control signal, the first voltage level being approximately the power supply voltage for at least some of the allowable range of the power supply voltage and the first voltage level being approximately the voltage greater than the power supply voltage for at least some of the allowable range of the power supply voltage.

18. The apparatus, as recited in claim 17, wherein the second threshold voltage has an absolute value of at least the magnitude of the power supply voltage for at least some of the allowable range of the power supply voltage.

19. The apparatus, as recited in claim 17, wherein the means for selectively coupling comprises:

means for generating the control signal having having a voltage level greater than the power supply voltage for at least some of the allowable range of power supply voltage.

20. The apparatus, as recited in claim 19, further comprising:

means for generating a voltage level having a magnitude larger than the power supply voltage for at least some of the allowable range of power supply values.

21. An integrated circuit comprising:

a switch circuit configured to selectively couple a first node thereof to a second node thereof, the switch circuit comprising at least a transistor of a first type having a threshold voltage higher in magnitude than a threshold voltage of a second transistor of the first type on the integrated circuit, the switch circuit being responsive to a control signal configured to selectively have a first state and a second state, wherein the control signal has approximately a ground voltage during the first state and a first voltage level during the second state, the first voltage level being approximately a power supply voltage for at least some of the allowable range of the power supply voltage and the first voltage level being approximately a voltage greater than the power supply voltage for at least some of the allowable range of the power supply voltage.

22. The integrated circuit, as recited in claim 21, wherein the at least one switch circuit is included in a varactor circuit.

23. A method comprising:

supplying, on an integrated circuit, a power supply voltage to transistors of a first transistor type of a first conductivity type, the first transistor type having a first threshold voltage of an absolute value less than the power supply voltage over an allowable range of the power supply voltage; and supplying, on the integrated circuit, a control signal to at least one switch circuit for selectively coupling a first node thereof to a second node thereof, the switch circuit comprising at least transistors of a second transistor type and of the first conductivity type, the second transistor type having a threshold voltage higher in magnitude than the first transistor type, the switch circuit being responsive to at least a control signal having a first state and a second state, wherein the control signal has approximately a ground voltage during the first state and a first voltage level during the second state, the first voltage level being approximately the power supply voltage for at least some of the allowable range of the power supply voltage and the first voltage level being approximately the voltage greater than the power supply voltage for at least some of the allowable range of the power supply voltage.

24. The method, as recited in claim 23, wherein the transistor of the second transistor type has an oxide thickness greater than an oxide thickness of the transistors of the first transistor type.

25. The method, as recited in claim 23, wherein the transistor of the second transistor type has a lower leakage current than the transistors of the first transistor type.

26. The method, as recited in claim 23, wherein the second threshold voltage has an absolute value of at least the magnitude of the power supply voltage for at least some of the allowable range of the power supply voltage.

27. The method, as recited in claim 23, further comprising:

supplying a DC voltage level larger than the power supply voltage for supplying the control signal in the one of the two states having a magnitude larger than the magnitude of the power supply voltage.

28. The method, as recited in claim 27, wherein a clock driver circuit generates the larger power supply voltage and the control signal.

29. The method, as recited in claim 23, wherein the supplying the control signal comprises:

charging a first node and a second node to a first voltage level no larger than the power supply voltage;

boosting the voltage on the first node and the second node from the first voltage level to a second voltage level larger than the power supply voltage, the voltage on the first node being boosted out of phase with the boosting of the voltage on the second node;

driving a first output node and a second output node to the second voltage level by the first node and the second node, the second output node being driven out of phase with the first output node; and discharging the first and second output nodes to ground, the second output node being discharged out of phase with the first output node.

30. The method, as recited in claim 23, further comprising:

holding a charge proportional to a signal transferred between the first node of the switch and a second node of the switch circuit on a capacitive node of a sample and hold circuit.

31. The method, as recited in claim 23, further comprising:

adjusting a frequency response of a filter based on at least a varactor circuit comprising the switch circuit.

32. An integrated circuit comprising:

a circuit portion comprising transistors of a first transistor type of a first conductivity type, the first transistor type having a first threshold voltage of an absolute value less than a power supply voltage of the integrated circuit operably coupled to the circuit portion over an allowable range of the power supply voltage; and at least one switch circuit for selectively coupling a first node thereof to a second node thereof, the switch circuit comprising at least a transistor of a second transistor type, and of the first conductivity type, the second transistor type having a second threshold voltage higher in magnitude than the first threshold voltage, the switch circuit being responsive to at least a control signal having a first state and a second state, the control signal, in the first state, having a magnitude larger than the magnitude of the power supply voltage for at least some of the allowable range of the power supply voltage, a voltage boosting circuit responsive to at least the power supply voltage and configured to provide a signal having a voltage level of the power supply voltage boosted by a multiplier; and a level shifting circuit responsive to at least the signal and a second control signal and configured to provide the control signal, the control signal having an amplitude larger than the power supply voltage.

* * * * *